(12) United States Patent
Hasegawa

(10) Patent No.: US 6,285,232 B1
(45) Date of Patent: Sep. 4, 2001

(54) DRIVER CIRCUIT AND OUTPUT STABILIZING METHOD THEREFOR

(75) Inventor: Masahiro Hasegawa, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/670,465

(22) Filed: Sep. 26, 2000

(30) Foreign Application Priority Data

Sep. 27, 1999 (JP) .................................... 11-272039

(51) Int. Cl.$^7$ .............................. H03K 5/08; H03K 17/56
(52) U.S. Cl. .......................... 327/321; 327/108; 327/423
(58) Field of Search .................................. 327/309, 310, 327/313, 314, 321, 326, 327, 328, 331, 588, 423, 108, 111, 112, 51–57; 326/115, 119, 121

(56) References Cited

U.S. PATENT DOCUMENTS

| | | | |
|---|---|---|---|
| 4,420,786 | * 12/1983 | Toney ..................................... | 327/423 |
| 5,459,654 | * 10/1995 | Williams et al. ..................... | 327/108 |
| 5,825,207 | * 10/1998 | Ito ........................................ | 327/108 |
| 6,052,003 | * 4/2000 | Molin et al. .......................... | 327/112 |
| 6,052,017 | * 4/2000 | Pidutti et al. ........................ | 327/588 |

FOREIGN PATENT DOCUMENTS

| | | |
|---|---|---|
| 11-8535 | 1/1999 | (JP) . |
| 11-8542 | 1/1999 | (JP) . |
| 11-85343 | 3/1999 | (JP) . |

OTHER PUBLICATIONS

IEEE Standard for Low–Voltage Differential Signals for SCI (LVDS) Draft 1.00 Dec. 30, 1993.

* cited by examiner

Primary Examiner—Toan Tran

(57) ABSTRACT

One end of a current source transistor is connected to a standard power source (VDD), and the gate of the first current source transistor is applied with a bias potential B1 for stabilizing fluctuations in current. The gate of a current source transistor is connected to the other end of the current source transistor, and the other end of the current source transistor is connected to GND. Output NMOS transistors are connected in series between the current source transistors. Output NMOS transistors are connected in series between the current source transistors, while the output NMOS transistors are connected in parallel with said the output NMOS transistors. An output terminal is provided between the output NMOS transistors, and an output terminal is provided between the output NMOS transistors. A terminal resistance is provided between the output terminals. Output NMOS transistors and NMOS transistors, which compose clamp circuits, are provided at both ends of the terminal resistance. The clamp circuit has the same direction in the fluctuation of ON resistance due to temperature and process fluctuations as ON resistance caused by temperature and process.

14 Claims, 8 Drawing Sheets

DRIVER CIRCUIT AND OUTPUT STABILIZING METHOD THEREFOR

BACKGROUND OF THE INVENTION

1. Field of the Invention

The present invention particularly relates to a driver circuit used for an LVDS interface. In particular, the present invention relates to the driver circuit suitable for stabilizing the output level, and an output stabilizing method therefor.

2. Description of the Related Art

In recent years, an LVDS (low voltage differential signals) interface is given much attention as a fast transmission interface for small amplitude signals. The LVDS is a standard for differential small-amplitude interfaces, which is being advanced by IEEE to be standardized. (refer to "IEEE Standard for Low-Voltage Differential Signals for SCI, LVDS P1596.3 December 1993").

In this LVDS standard, the output signal of a driver circuit is specified as a differential small-amplitude signal in the order of 1.0 V to 1.4 V. The main characteristic of the driver circuit is that by switching a current path of a predetermined signal current, the driver circuit generates a current flow in an equilibrium transmission line and terminal resistance (100Ω), which are located between a receiver circuit and the driver circuit, and generates a signal voltage between the both terminals of the terminal resistance to transmit the signal.

One of the drawbacks of the conventional LVDS driver circuit is that temperature or process fluctuations cause the output level to shift and fall outside of the specification.

One example of such a driver circuit is shown in FIG. 1. In the drawing, reference numerals 1 and 6 designate current source transistors, and reference numerals 2 to 5 designate output NMOS transistors for switching signals.

An terminal resistance 9 is connected between output terminals 7, 8. The gate of the current source transistor 1 is applied with a bias voltage B1 which is outputted from a standard voltage circuit 13.

Inverse signals of the gate signals of the output NMOS transistors 3, 4 are inputted to the gates of output NMOS transistor 2, 5. By the input signals, the current path is switched, and output levels of the output terminals 7, 8 are generated by the current flow in the terminal resistance 9.

Also, in order to stabilize the current fluctuation of the current source caused by temperature and process fluctuations, the bias voltage B1 is generated by the standard voltage circuit 13 to be supplied to the gate of the current source transistor 1. Also reference numeral 14 in the drawing indicates a borderline between the interior and exterior of a chip or circuit.

One example of the structure of standard voltage circuit 13 is explained here using FIG. 2. In general, the standard voltage circuit 13 is constructed of a sense amplifier or the like, and has a constant current input terminal 12 and a terminal which is applied with a bias voltage B1 as external terminals. Also, standard voltage circuit 13 can be constructed of one I/O cell.

By inputting a voltage generated by a constant current inputted from the constant current input terminal 12 and a standard voltage generated by PMOS transistors 15, 16 to the sense amplifier, the bias voltage B1 for stabilizing the current is supplied to the current source transistor 1 in FIG. 1. In the figure, reference numerals 17, 18, 19, 22 designate PMOS transistors, and reference numerals 20, 21 designate NMOS transistors.

On the other hand, a drain voltage of the current source transistor 1 is inputted to the gate of the current source transistor 6 in FIG. 1. The amount of current of the current source transistor 1 is controlled by the bias voltage B1. The drain voltage of the voltage source transistor 1 is sufficient enough to turn on the current source transistor 6.

The conventional structure can supply a constant current regardless of the temperature and process fluctuations; however, it cannot sufficiently suppress the output level fluctuations of the ON resistance of the output NMOS transistors 2 to 5 due to the temperature and process fluctuations.

That is, by the process fluctuation, the threshold voltages (Vt) of the output NMOS transistors 2 to 5 may become high. Also, under a high temperature condition, the ON resistance of the current source transistor 1 becomes small as a whole, and the ON resistance of the output NMOS transistors 2 to 5 and current source transistor 6 become large. Therefore, the output level shifts to the power source side (VDD) as a whole, and the center of the amplitude (VOS) also shifts to the VDD side.

Conversely, the conditions such as where Vt becomes lower, or the temperature is low, the ON resistance of the current source transistor 1 becomes larger as a whole, and the ON resistance of the output NMOS transistors 2 to 5 and current source transistor 6 become smaller. Because of this, the output level shifts to the GND side as a whole, and VOS also shifts to the GND side.

FIG. 3 shows the fluctuations of the output HIGH level (VOH), output low level (VOL), and the center of the amplitude (VOS) due to the fluctuations of temperature and process.

The center of the amplitude is defined as VOS=(VOH+VOL)/2, and in the LVDS standard the center of the amplitude is specified as VOS=1.125 to 1.275 (V). Here, when Vt becomes higher caused by the process fluctuation, or under a high temperature condition, the output level shifts to the VDD side as a whole, and VOS shifts to the VDD side as well, resulting in the VOS exceeding the maximum side of the standard.

Conversely, when Vt becomes lower, or under the condition of lowering temperature, the output level shifts to the GND side as a whole, and VOS shifts to the GND side as well, resulting in VOS being lower than the minimum side of the standards.

Therefore, a driver circuit which can control the fluctuations of the output level regardless of the fluctuations of the temperature or the process is in demand.

In order to respond to such a demand, in Japanese Patent Laid-open Publication No. Hei 11-85343, the fluctuations of the output level of the driver circuit due to the temperature or process fluctuation are suppressed by generating bias for the upper and lower current source transistors by means of a returning standard voltage circuit.

That is, as shown in FIG. 4, the driver circuit is provided with current source transistors 1, 6 and output NMOS transistors 2 to 5. An terminal resistance 9 is connected between the output terminals 7 and 8. The bias B1 and bias B2 are supplied respectively, to the gates of the current source transistors 1, and 6 from the returning standard voltage circuit 24.

As shown in FIG. 5, the returning standard voltage circuit 24 has a terminal 26 for a HIGH side standard voltage (VH) which is applied externally, a terminal 29 for a LOW side standard voltage (VL), terminals 27 and 28 which connect a standard resistor 25, and a terminal which outputs the biases B1 and B2. Between the terminals 27 and 28, the standard resistor 25 is provided.

The returning standard voltage circuit 24 also has comparators 30, 31 which input the standard voltages VH and VL. Also, the returning standard voltage circuit 24 has transistors 34, 35 which generate the output HIGH level, transistors 37, 38 which generate the output LOW level, and capacitors 32, 33 which implement a stability thereof.

The returning standard voltage circuit 24 generates a dummy output level for the driver circuit within the returning standard voltage circuit 24 by transistors 34 to 38. Using this dummy output level as a returning voltage, the returning standard voltage circuit 24 compares the standard voltages VH, VL with them using comparators 30, 31. By the comparison result, the returning standard voltage circuit 24 controls biases B1 and B2.

The returning standard voltage circuit 24 provides the current source transistors 1, 6 shown in FIG. 4 with bias B1 and bias B2, which stabilize the current of the current source and accurately correct the output level.

However, the above-mentioned prior art has a drawback that the circuit size of the returning standard voltage circuit 24 becomes large. This is, because the comparators 30, 31 which compare the output signals of the driver circuit with the standard voltages VH, VL are necessary for both biases B1, B2.

Moreover, it is necessary to obtain high precision standard voltages VH, VL and standard resistor 25. Construction of the resistor and standard voltages with such high accuracy and fit all of them internally within the circuit is also technically difficult. If a resistor and standard voltages of lower precision are used, the accuracy of the returning standard voltage 24 becomes lower as well, and precise correction cannot be achieved.

In reality, if those resistor and standard voltages are supplied externally, it is necessary to have 4 terminals as the external connection terminals 26 to 29, and at least 4 I/O cells are necessary for the returning standard voltage circuit 24 only. Therefore, not only the circuit size becomes larger, but also the cost becomes higher due to the increase in the pin number of the increased external terminals.

Moreover, because the size of the returning standard voltage circuit 24 is very large, when it is used for multiple output buffers in common, to generate the returning voltage of the output level in the returning standard voltage circuit 24, the accuracy of the correction for fluctuation of the output level of the driver circuit decreases by placement in the chip.

As shown in Japanese Patent Laid-open Publication No. Hei. 11-008542, for example, the voltage supplied to the output transistor may be controlled by a voltage controlling circuit to control fluctuation of the amplitude as an alternative LVDS driver circuit.

In this conventional art, however, although it is possible to control the amplitude by controlling the supply voltage to the output transistor, the center of the amplitude of the voltage control circuit itself is difficult to suppress.

Also there are other LVDS driver circuits, such as the one shown in Japanese Patent Laid-open Publication No. Hei. 11-008535. However, this conventional art has a problem of becoming a large circuit structure.

SUMMARY OF THE INVENTION

An object of the present invention is to provide a driver circuit used in an LVDS interface and an output stabilization method therefor, in which the circuit size can be made small and fluctuations of the output level due to process and temperature can be suppressed.

A driver circuit according to the present invention includes a first current source transistor, one end of the first current source transistor being connected to a first standard power source, a gate of the first current source transistor being applied with a bias potential for stabilizing fluctuations in current from the first standard power source; a second current source transistor, a gate of the second current source transistor being connected to the other end of the first current source transistor, the other end of the second current source transistor being connected to a second standard power source; first and second output transistors connected in series between the other end of the first current source transistor and one end of the second current source transistor; third and fourth output transistors connected in series between the other end of the first current source transistor and the other end of the second current source transistor, the third and fourth output transistors being connected in parallel with the first and second output transistors; a first output terminal provided between the first and second output transistors; a second output terminal provided between the third and fourth output transistors; an terminal resistance provided between the first and second output terminals; and clamp circuits provided at both ends of the terminal resistance.

Also, the clamp circuits may be composed of first and second MOS transistors, one end and a gate of the MOS transistors may be connected to the first standard power source in common, and the other end of the MOS transistors may be connected to the terminal resistor.

Also, the first and second MOS transistors may be composed of NMOS, the one end thereof may be a drain, and the other end thereof may be a source.

Also, the clamp circuits may be provided within the same chip, and the direction of fluctuations in the ON resistance of the clamp circuits due to temperature and process fluctuations may be made the same as those of the first to fourth output transistors.

Also, the bias potential may be provided by a standard potential circuit, and the gate of the second current source transistor may be applied with a potential from the other end of the first current source transistor.

Also, the bias potential may be applied to the gates of the first and second current source transistors, respectively.

Also, when a test or output enable function is needed, the gates of the clamp circuits can be provided with logic signals including the corresponding signal logic.

An output stabilization method for a driver circuit according to the present invention includes a first step of connecting one end of a first current source transistor to a first standard power source, and applying to a gate of the first current source transistor a bias potential for stabilizing fluctuations in current from the first standard power source; a second step of connecting a gate of a second current source transistor to the other end of the first current source transistor, and connecting the other end of the second current transistor to a second standard power source; a third step of connecting first and second output transistors in series between the other end of the first current source transistor and one end of the second current source transistor; a fourth step of connecting third and fourth output transistors in series between the other end of the first current source transistor and one end of the second current source transistor while the third and fourth output transistors are arranged in parallel with the first and second output transistors; a fifth step of providing a first output terminal between the first and second output transistors; a sixth step of providing a second output terminal between the third and fourth output transistors; a seventh step of providing an terminal resistance between the first and second output terminals; and an eighth step of providing clamp circuits at both ends of the terminal resistance, respectively.

Also, the eighth step may include a ninth step of composing the clamp circuits by first and second MOS transistors, connecting one end and a gate of the MOS transistors to the first standard power source in common, and connecting the other end of the MOS transistors to the terminal resistor.

Also, the ninth step may include a tenth step of composing the first and second MOS transistors by NMOS, and making the one end thereof be a drain and the other end thereof be a source.

Also, the eighth to tenth steps may include an eleventh step of providing the clamp circuits within the same chip, and making the direction of fluctuations in the ON resistance of the clamp circuits due to temperature and process fluctuations be the same as those of the first to fourth output transistors.

Also, the first step may include a twelfth step of providing the bias potential by a standard potential circuit, and the second step may include a thirteenth step of applying to the gate of the second current source transistor a potential from the other end of the first current source transistor.

Also, the first and second steps may include a fourteenth step of applying the bias potential to the gates of the first and second current source transistors, respectively.

Also, the eighth to eleventh steps may include a fifteenth step of providing, when a test or output enable function is needed, logic signals including the corresponding signal logic to the gates of the clamp circuits.

According to the driver circuit and its output stabilization method of the present invention, the circuit size can be made small and fluctuations of the output level due to process and temperature can be suppressed by connecting one end of a first current source transistor to a first standard power source, and applying to a gate of the first current source transistor a bias potential for stabilizing fluctuations in current from the first standard power source; connecting a gate of a second current source transistor to the other end of the first current source transistor, and connecting the other end of the second current transistor to a second standard power source; connecting first and second output transistors in series between the other end of the first current source transistor and one end of the second current source transistor; connecting third and fourth output transistors in series between the other end of the first current source transistor and one end of the second current source transistor while the third and fourth output transistors are arranged in parallel with the first and second output transistors; providing a first output terminal between the first and second output transistors; providing a second output terminal between the third and fourth output transistors; providing an terminal resistance between the first and second output terminals; and by providing clamp circuits at both ends of the terminal resistance, respectively, where the direction of fluctuations in the ON resistance of the clamp circuits due to temperature and process fluctuations is the same as those of the first to fourth output transistors.

The nature, principle, and utility of the invention will become more apparent from the following detailed description when read in conjunction with the accompanying drawings in which like parts are designated by like reference numerals or characters.

DETAILED DESCRIPTION OF THE PREFERRED EMBODIMENT

The preferred embodiments of the present invention will now be described in detail below.

(First Embodiment)

Figure 2:
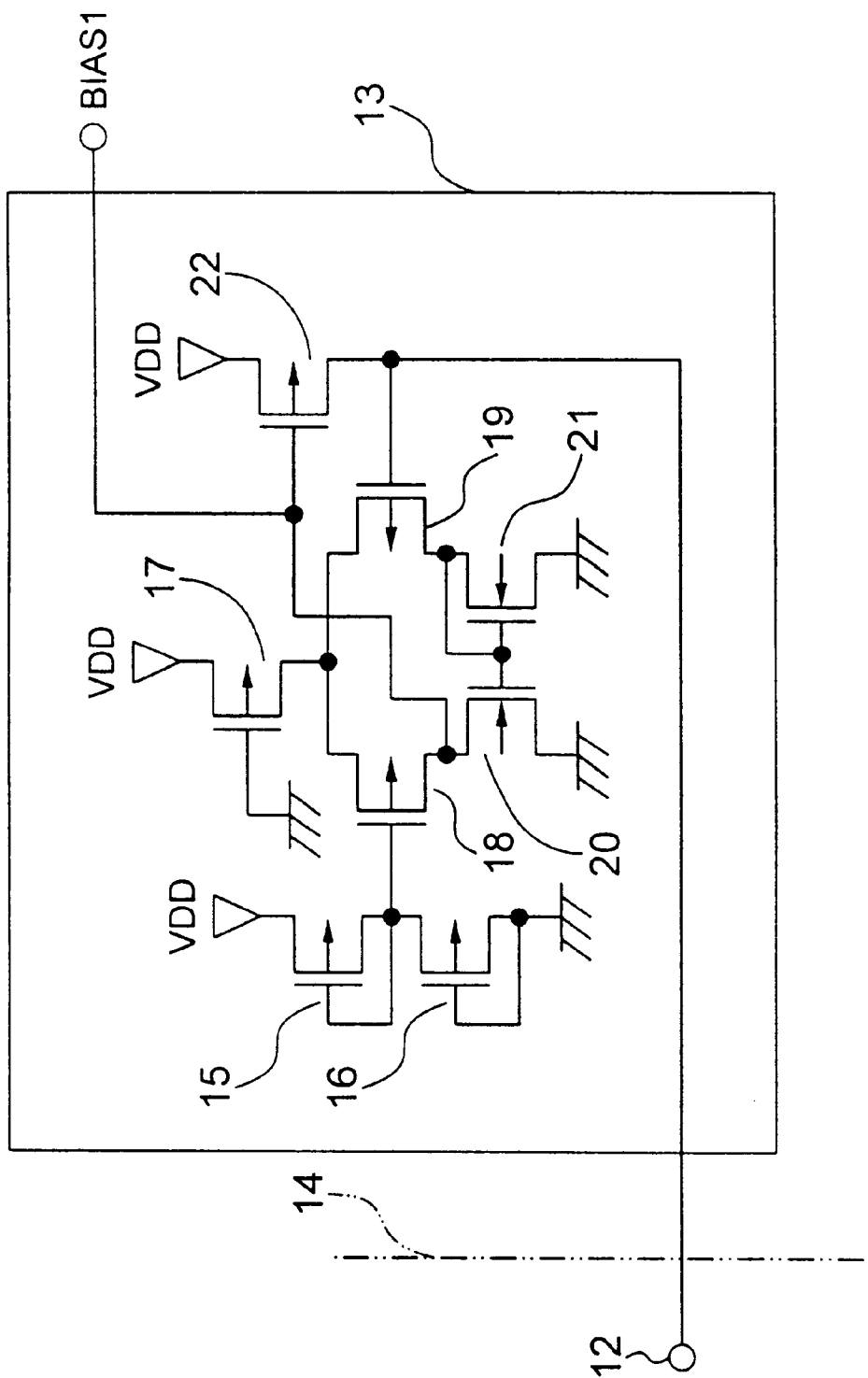
FIG. 2 is a circuit diagram showing the details of the standard voltage circuit of FIG. 1.
Figure 3:
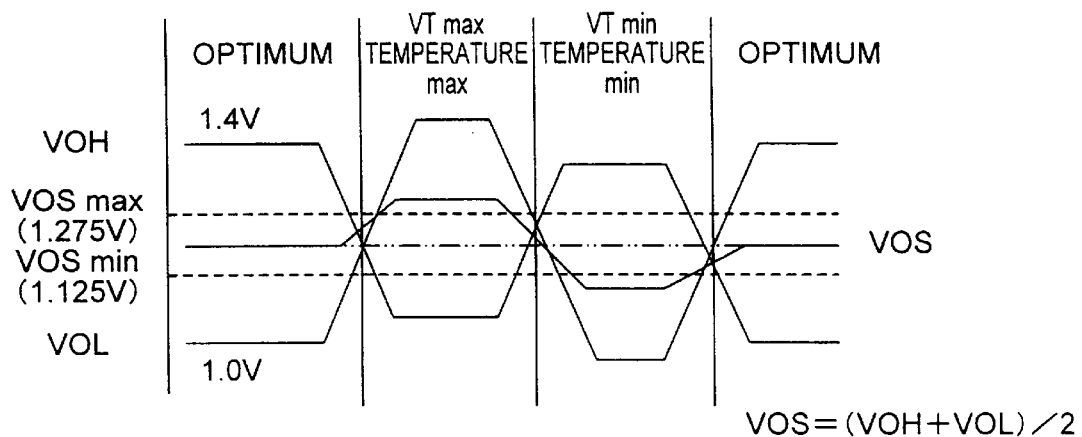
FIG. 3 is a circuit diagram showing another example of the conventional driver circuit.
Figure 6:
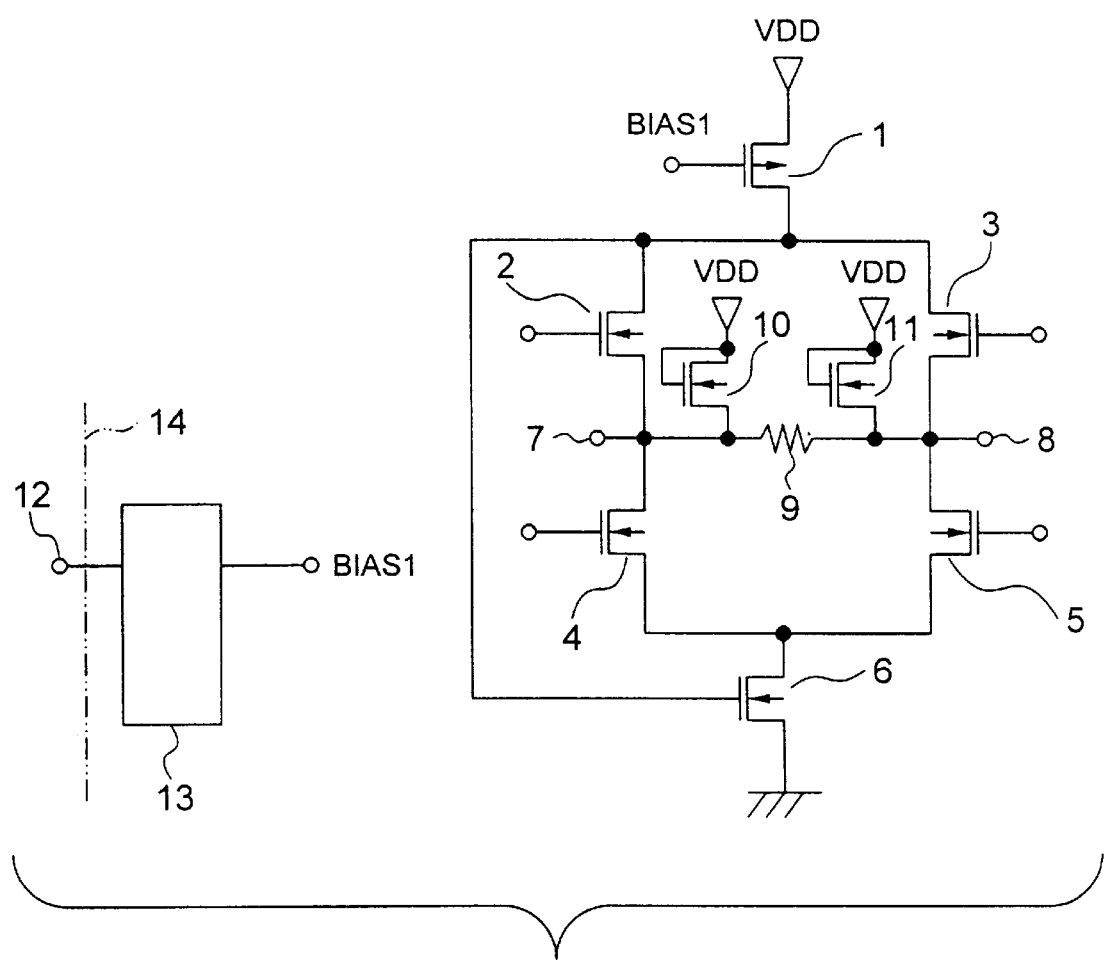
FIG. 6 is a circuit diagram showing a first preferred embodiment of a driver circuit according to the present invention.
Figure 7:
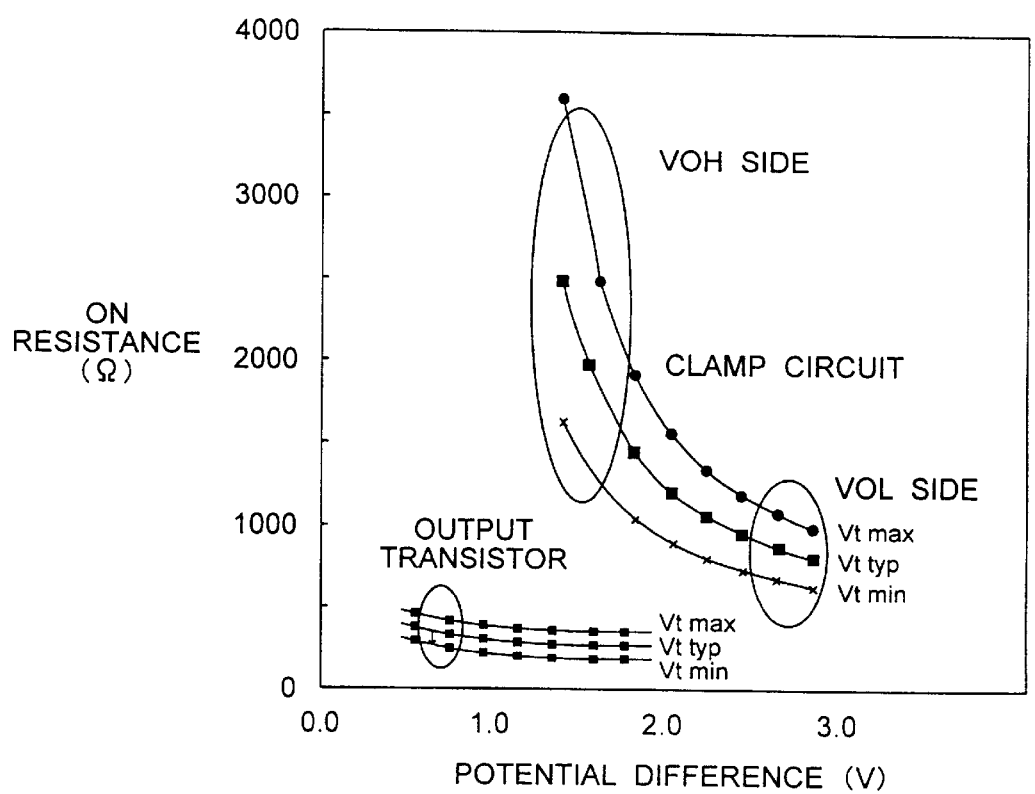
FIG. 7 is a graph showing the relationship between potential differences between the drain and the source for MOS transistors in the connecting condition in FIG. 6 and MOS transistor which constructs clamp circuit, and on resister fluctuation curve which are shown in the process fluctuation for each Vt.
Figure 9:
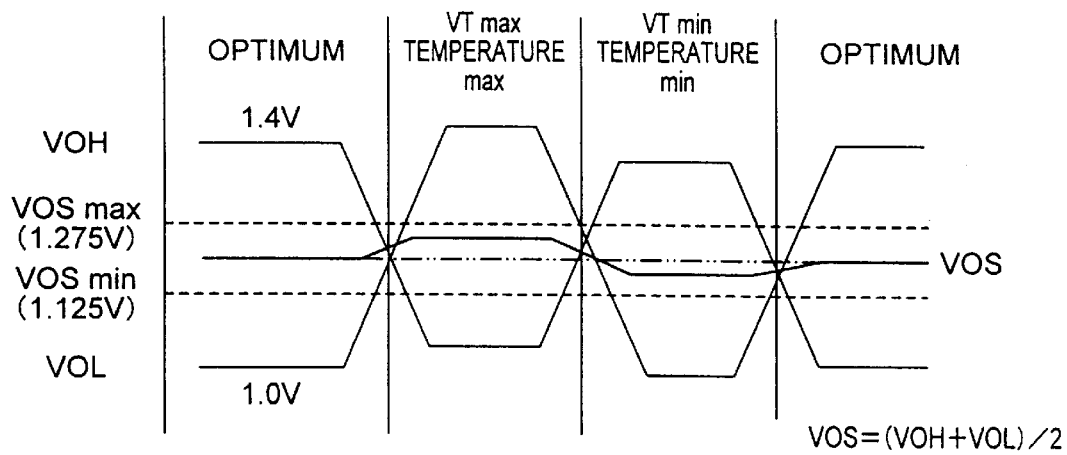
FIG. 9 is a drawing showing the operation of the driver circuit of FIG. 6.

FIG. 6 is a circuit diagram showing a first preferred embodiment of a driver circuit according to the present invention, FIG. 2 is a circuit diagram showing the details of a standard voltage circuit in FIG. 6, and FIG. 7 though FIG. 9 are the explanatory drawings explaining the operations of the driver circuit in FIG. 6.

Figure 4:
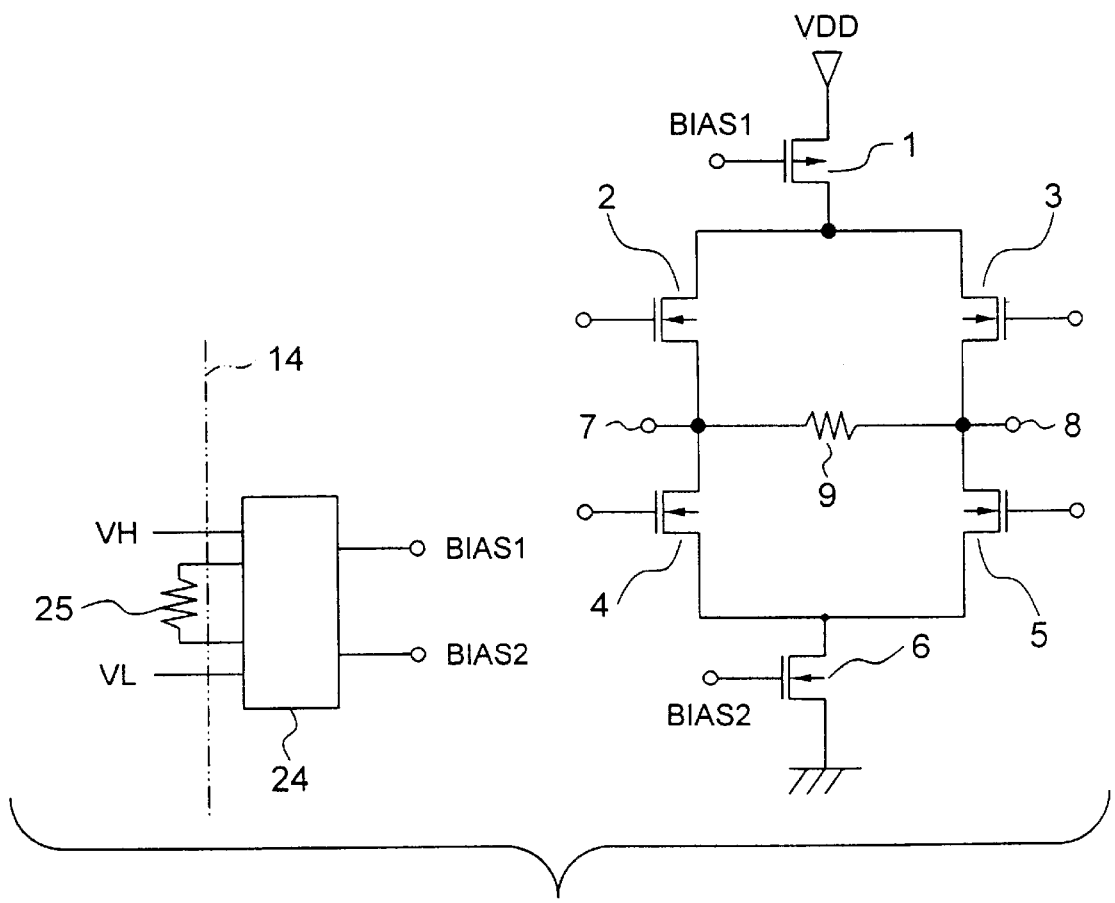
FIG. 4 is a circuit diagram showing still another example of the conventional driver circuit.
Figure 5:
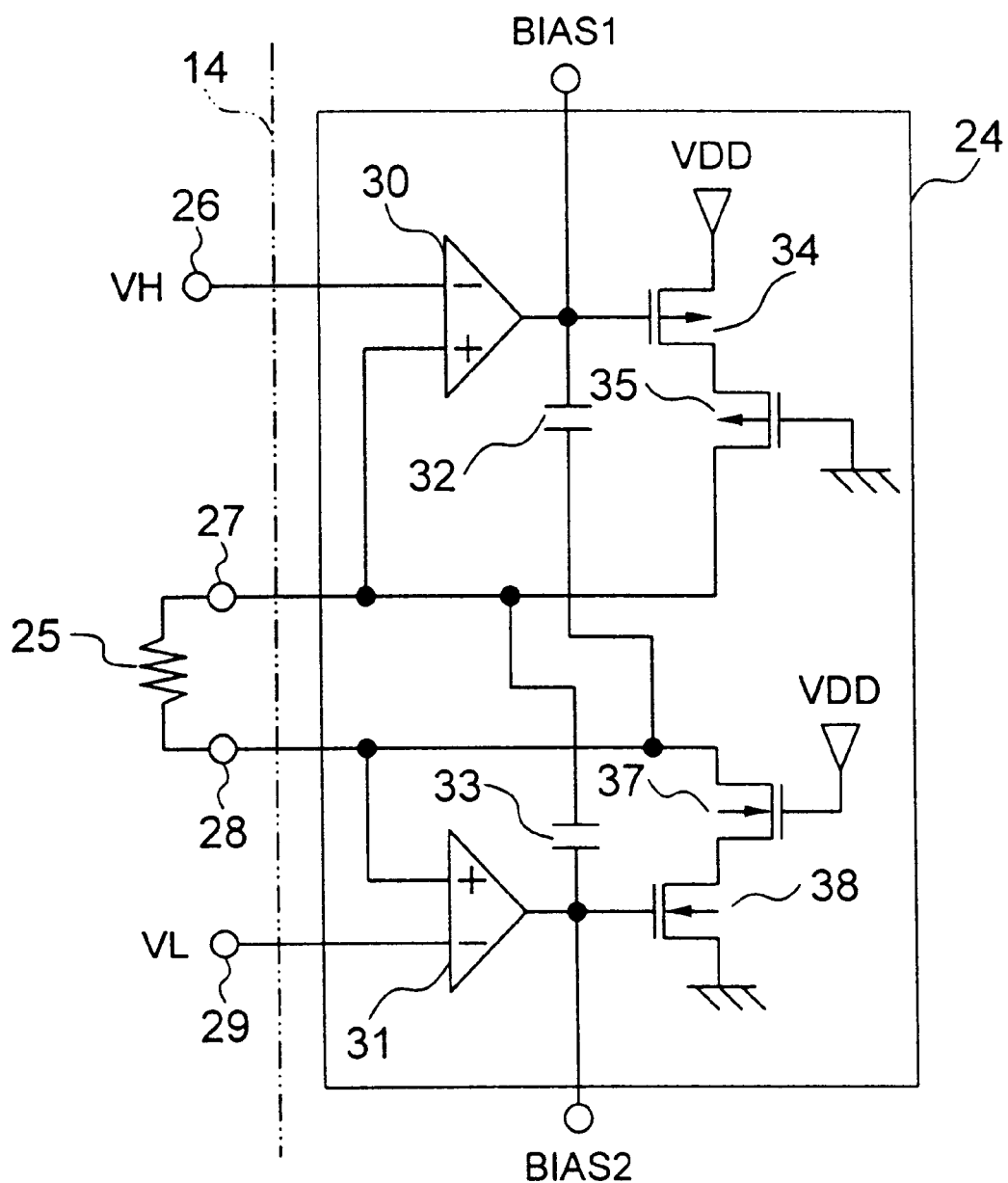
FIG. 5 is an explanatory drawing for explaining the operation of the driver circuit of FIG. 1.

Here, the drawings described below have the same reference numerals for the common parts in FIG. 1 and FIG. 4.

Figure 1:
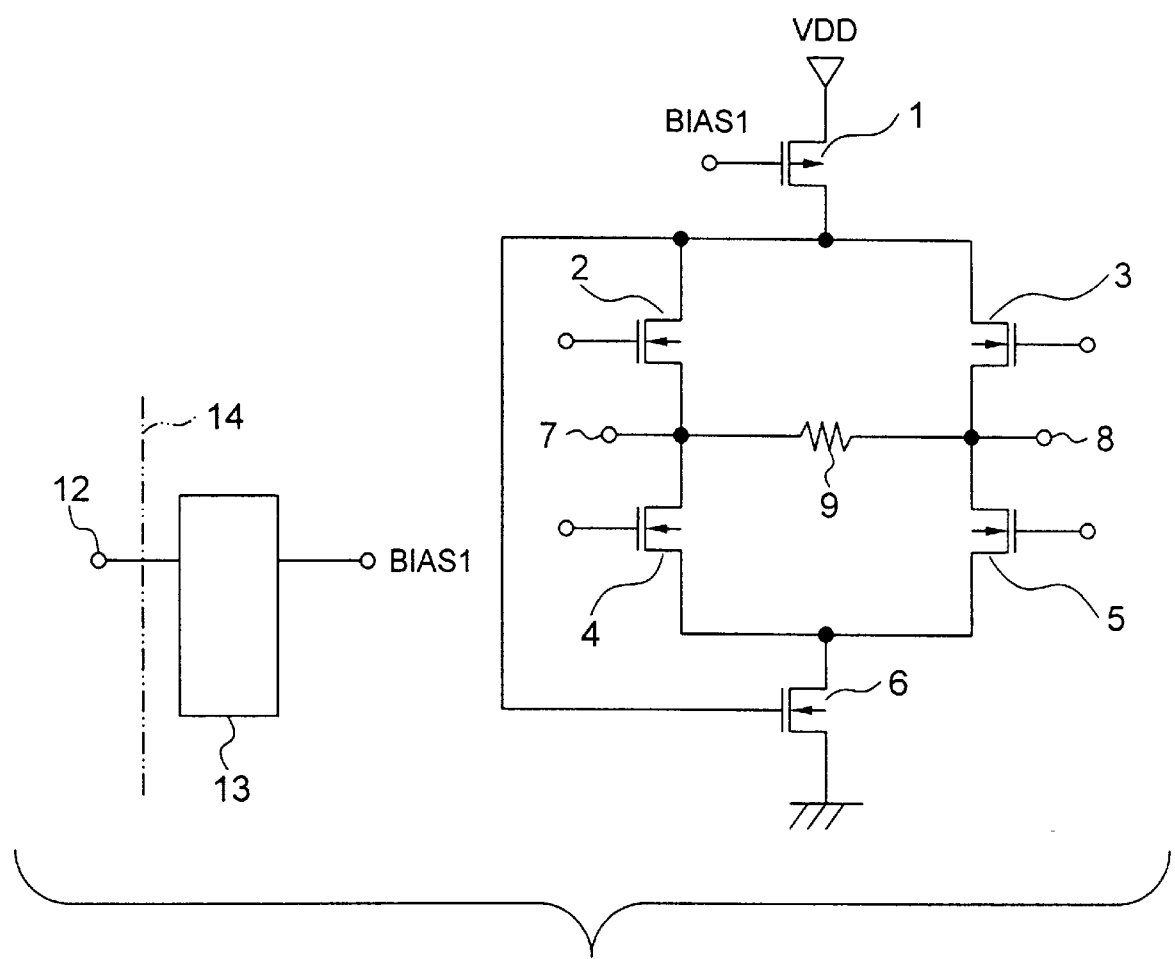
FIG. 1 is a circuit diagram showing one example of a conventional driver circuit.

Similarly to FIG. 1, the driver circuit shown in FIG. 6 is provided with current source transistors 1, 6, the output NMOS transistors 2 to 5 for switching signals, terminal resistance 9, and output terminals 7, 8. Here, the current source transistor 1 is a first current source transistor, and the current source transistor 6 is a second current source transistor. Also, the output NMOS transistor 2 is a first output transistor, the output NMOS transistor 4 is a second output transistor, the output NMOS transistor 3 is a third output transistor, and the output NMOS transistor 5 is a fourth output transistor. Moreover, the output terminal 7 is a first output terminal, and the output terminal 8 is a second output terminal.

The source of the current source transistor 1 is connected to the standard power source (VDD) as a first standard power source, and the bias B1 is applied to the gate as a bias voltage to stabilize the fluctuations of the current.

One terminal of the current source transistor 6 is connected to the terminal of the current source transistor 1, and the other terminal thereof is connected to the standard voltage (GND) as a second standard voltage. Output NMOS transistors 2, 4 are connected in series between the current source transistors 1 and 6. Output NMOS transistors 3 and 5 are connected in series between the current source transistors 1 and 6, and also in parallel with the output NMOS transistors 2, 4. Output terminal 7 is provided between the output NMOS transistors 2 and 4, and output terminal 8 is provided between the output NMOS transistors 3 and 5. Terminal resistance 9 is provided between the output terminals 7 and 8. The output NMOS transistors 2 to 5 and NMOS transistors 10, 11, which compose clamp circuits, are provided at both ends of the terminal resistance 9. The clamp circuit has the same direction in the fluctuation of ON resistance due to temperature and process fluctuations as ON resistance caused by temperature and process.

The difference from the FIG. 1 is that the NMOS transistors 10, 11 as clamp circuits are connected to both ends of the terminal resistance 9. Here, the NMOS transistor 10 is a first MOS transistor, and the NOMS transistor 11 is a second MOS transistor.

These clamp circuits are installed within the same chip. These clamp circuits have the same direction in the fluctuations of the ON resistance due to temperature and process fluctuations as those of the output NMOS transistors 2 to 5.

The drain voltage of the current source transistor 1 is inputted to the gate of the current source transistor 6. Also, the inverse signals of the gate signals of the output NMOS transistors 3, 4 are inputted to the gates of the output NMOS transistors 2, 5. By these input signals, the current path is switched, and output levels are generated at the output terminals 7, 8 by the current flow in the terminal resistance 9.

NMOS transistors 10, 11 are diode-connected. The source sides, which are the other ends, of the NMOS transistors 10, 11 are connected to the output terminals 7, 8. Their drain sides, which are one ends, are connected to the power source VDD. Moreover, the drain—gate is connected in common.

The gate of the current source transistor 1 is applied with bias B1, which is a bias voltage from the standard voltage circuit 13 which has a constant current input terminal 12. Fluctuations in current of the current source transistor 1 is stabilized by the bias B1. In the drawing, reference numeral 14 designates the borderline between the interior and the exterior of a chip or circuit.

As shown in FIG. 2, the standard voltage circuit 13 is composed of a sense amplifier or the like in general. The standard voltage circuit 13 has the above-mentioned constant current input terminal 12, and a terminal which outputs the bias B1. In the drawings, reference numerals 17, 18, 19, 22 designate PMOS transistors, and 20, 21 designate NMOS transistors, respectively.

Next, the operation of the driver circuit with such a structure will be explained.

First, when the inverse signals of the gate signals of the output NMOS transistors 3, 4 are inputted to the gates of the output NMOS transistors 2, 5, the current path is switched by the input signals. Then, by the current flown in the terminal resistance 9, an output level is generated at the output terminals 7, 8.

The standard voltage circuit 13 inputs the voltage generated by the constant current from the constant current input terminal 12, and a standard voltage generated by the PMOS transistors 15, 16 to the sense amplifier. Next, the bias B1 which stabilizes the constant current is supplied to the gate of the current source transistor 1. The drain voltage of the current source transistor 1 is inputted to the gate of the current source transistor 6.

Here, FIG. 7 is a graph showing for each threshold voltage (Vt) due to the process fluctuations. It shows the relationship between the potential difference between the drain and the source of the output NMOS transistors 2 to 5 and NMOS transistors 10, 11 which compose the clamp circuits, which are connected as shown in FIG. 6, and the ON resistance fluctuation curve.

However, the output NMOS transistors 2 to 5, and the NMOS transistors 10, 11 are shown by the value for one transistor. The parts which are marked by circles in the graph show the range used by this preferred embodiment structure. That is, because the NMOS transistors 10, 11, or the clamp circuits are diode-connected, the fluctuation characteristic of the ON resistance has a rapid fluctuation, as compared with the output NMOS transistors 2 to 5.

Also, the clamp circuit which is on the side of the output high level (VOH) due to the temperature and process fluctuations is used near Vt, and the clamp circuit which is on the side of the output low level (VOL) is used in the ON-region.

Therefore, because the output levels of the VOH side and VOL side have different potential differences with respect to the power source, the resistance values of the clamp circuits fluctuate. Here, the VOH side becomes a high resistance, and reduces the current amount of the clamp circuit. On the other hand, the VOL side becomes a low resistance, and increases the current amount of the clamp circuit.

Also, the NMOS transistors 10, 11 and the output NMOS transistors 2 to 5 have the same direction of the fluctuation of the ON resistance due to temperature, process fluctuations. Thus, when the ON resistances of the output NMOS transistors 2 to 5 become large, the ON resistances of the NMOS transistors 10, 11 becomes large as well, resulting in decrease in the current amount. When the ON resistances of the output transistors 2 to 5 become small, the ON resistances of the NMOS transistors 10, 11 become small as well, resulting in an increase in the current amount.

Here, the operation of the NMOS transistors 10, 11 will be explained. When the Vt becomes high due to process fluctuations, or under a high temperature condition, the ON resistance of the current source transistor 1 becomes small for the whole circuit, while the ON resistances of the output NMOS transistors 2 to 5 and the current source transistor 6 may become large. Thus, the output level shifts to the VDD side as a whole, and VOS shifts to the VDD side as well.

At this time, the NMOS transistors 10, 11 interlock with output NMOS transistors 2 to 5 to have a larger ON resistance, so that the current flowing in the NMOS transistors 10, 11 decreases.

The current of the clamp circuit which has decreased at the VOH side increases the total ON resistance in the current path which determines the level at the VOH side, and prevents the level at the VOH side from increasing towards the VDD side. Also, the current of the clamp circuit which has decreased at the VOL side decreases the current amount flowing in the current source transistor 6, and prevents the level at the VOL side from increasing. Because of this, the decrease of the current flowing in the end terminal 9 is prevented, and the decrease of the amplitude is suppressed.

Therefore, the output level can be prevented from shifting to the VDD side, and VOS can also be prevented from shifting to the VDD side as well.

Conversely, when the Vt becomes low or under a low temperature condition, the ON resistance of the current source transistor 1 becomes large as a whole circuit, and the ON resistances of the output NMOS transistors 2 to 5 and current source transistor 6 become small. Because of this, the output level shifts to the GND side as a whole, and VOS shifts to the GND side as well.

At this time, the MOS transistors 10, 11 interlock with the output NMOS transistors 2 to 5 to have a smaller ON resistance, the current flowing in the NMOS transistors 10, 11 becomes larger. The current of the clamp circuit which has increased at the VOH side decreases the total ON resistance of the current path which determines the level at the VOH side, and prevent the level at the VOH side from decreasing to the GND side.

Also, the current of the clamp circuit which has increased at the VOL side increases the current amount in the current source transistor 6, and prevents the level at the VOL side to decrease. Because of this, the increase of the current amount flowing in the terminal resistance 9 can be suppressed, so that the increase of the amplitude can be suppressed.

Therefore, the output level can be prevented from shifting to the GND side, and VOS can be prevented from shifting to the GND side as well.

Figure 8:
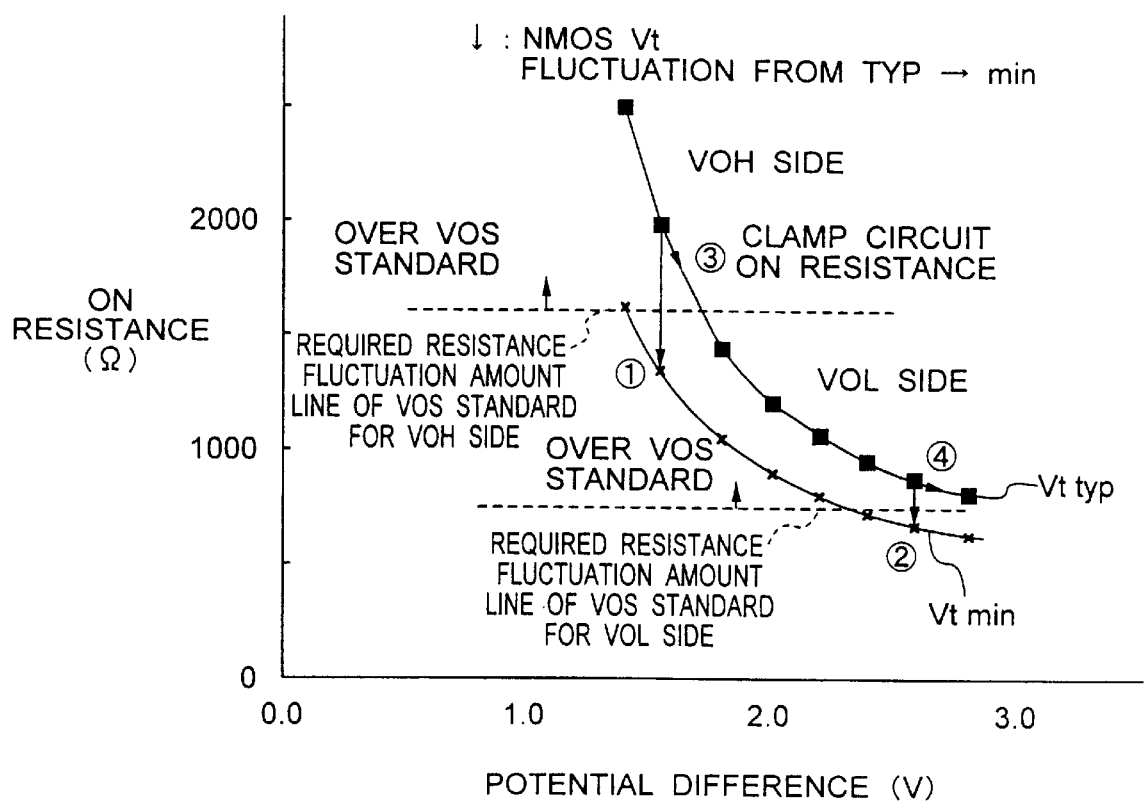
FIG. 8 is a graph showing the fluctuation in the ON resistance in FIG. 6.

The fluctuation of the ON resistance of the clamp circuit will be explained in detail using FIG. 8. FIG. 8 is the fluctuation diagram of the ON resistance, and shows the case where Vt of the NMOS becomes lower (min) due to the process fluctuations.

Because the output NMOS transistors 2 to 5 and NMOS transistors 10, 11 are composed of the same NMOS, when Vt of the output NMOS transistors 2 to 5 becomes low, the ON resistances of the output NMOS transistors 2 to 5 become small, and the output level shifts to the GND side.

However, since the clamp circuit is also NMOS, Vt of the NMOS transistors 10, 11 also becomes low, and Vt typ curve is fluctuated to Vt min curve. Further, at the VOH side, the resistance value becomes ①, and at the VOL side, the resistance value becomes ②.

The fluctuated resistance values ①, ② increase the current amount because the resistance value has become smaller than at the time of "typ"; and prevent the output levels at the VOL side and VOL side from shifting to the GND side. That is, when an externally attached diode having the same characteristics as the clamp circuit can be connected to the output terminal external to the chip, the ON resistance of the diode does not fluctuate by the process fluctuation.

Thus, Vt remains as "typ", the ON resistance does not fluctuate in the amount limited by the potential differences fluctuation to ③ at the VOH side, and ④ at the VOL side, so that it does not satisfy the required resistance fluctuation amount lines of VOS standard for the VOH side and the VOL side shown in the drawing.

Accordingly, the increase of the current amount necessary for small adjustment of the decline of the resistance value cannot be obtained, the output level shifts to the GND side, and the VOS standard cannot be satisfied. Also, the same is true for temperature fluctuation.

Accordingly, by composing the NMOS transistors 10, 11 or the clamp circuits within the same chip, and by making them have the same fluctuation direction of the ON resistance as the output NMOS transistors 2 to 5, the output level of the driver circuit can be stabilized.

Using FIG. 9, the VOS fluctuation of the driver circuit of the present embodiment caused by the process or temperature fluctuations will be explained. Table 1 below explains simulated comparison results of the conventional driver circuit and the driver circuit of the present embodiment. The Table 1 is the comparison result simulated by the 0.35 μm process.

TABLE 1

| VDD = 3.3 V | | Prior Art 1 | | | The Circuit of the present Invention | | |
|---|---|---|---|---|---|---|---|
| Process | TJ (° C.) | VOH(V) | VOL(V) | VOS(V) | VOH(V) | VOL(V) | VOS(V) |
| L: TYP | 0 | 1.310 | 1.038 | 1.174 | 1.361 | 1.044 | 1.203 |
| P: Vt typ | 25 | 1.315 | 1.080 | 1.198 | 1.358 | 1.047 | 1.203 |
| N: Vt typ | 100 | 1.330 | 1.100 | 1.215 | 1.355 | 1.062 | 1.209 |
| L: max | 0 | 1.386 | 1.147 | 1.267 | 1.351 | 1.057 | 1.204 |
| P: Vt max | 25 | 1.380 | 1.143 | 1.262 | 1.345 | 1.055 | 1.200 |
| N: Vt max | 100 | 1.358 | 1.127 | 1.243 | 1.334 | 1.058 | 1.196 |
| L: min | 0 | 1.201 | 0.968 | 1.085 | 1.359 | 0.999 | 1.179 |
| P: Vt min | 25 | 1.201 | 0.969 | 1.085 | 1.362 | 1.012 | 1.187 |
| N: Vt min | 100 | 1.195 | 0.967 | 1.081 | 1.369 | 1.048 | 1.209 |
| L: max | 0 | 1.219 | 0.977 | 1.098 | 1.367 | 1.007 | 1.187 |
| P: Vt max | 25 | 1.220 | 0.979 | 1.100 | 1.369 | 1.020 | 1.195 |
| N: Vt min | 100 | 1.218 | 0.982 | 1.100 | 1.378 | 1.058 | 1.218 |
| L: max | 0 | 1.420 | 1.190 | 1.305 | 1.352 | 1.066 | 1.209 |
| P: Vt min | 25 | 1.399 | 1.169 | 1.284 | 1.346 | 1.064 | 1.205 |
| N: Vt max | 100 | 1.376 | 1.152 | 1.264 | 1.333 | 1.064 | 1.199 |
| L: min | 0 | 1.376 | 1.146 | 1.261 | 1.352 | 1.062 | 1.207 |
| P: Vt min | 25 | 1.370 | 1.142 | 1.256 | 1.346 | 1.060 | 1.203 |
| N: Vt max | 100 | 1.347 | 1.123 | 1.235 | 1.333 | 1.059 | 1.196 |
| L: min | 0 | 1.208 | 0.965 | 1.087 | 1.365 | 0.997 | 1.181 |
| P: Vt max | 25 | 1.208 | 0.967 | 1.088 | 1.366 | 1.010 | 1.188 |
| N: Vt min | 100 | 1.200 | 0.965 | 1.083 | 1.382 | 1.060 | 1.221 |
| Simulation Result | min | | 0.965 | 1.081 | | 0.997 | 1.179 |
| | max | 1.420 | | 1.305 | 1.380 | | 1.221 |
| Center of Amplitude | min | | 0.925 | 1.125 | | 0.925 | 1.125 |
| Standard | max | 1.475 | | 1.275 | 1.475 | | 1.275 |
| From Center | | — | | | — | | |
| Fluctuation | | | | 0.119 | | | 0.021 |
| | | | | 0.105 | | | 0.021 |

As shown in the drawings and Table 1, the process was fluctuated by combining the conditions of thick L (max) of the transistor, and thin L (min) of the transistor with respect to the center "typ". Also, the process was fluctuated by combining the conditions of the high Vt (max) and the low Vt (min) of the PMOS and NMOS.

The simulation was conducted at the junction temperature (TJ) of 0 to 100 (° C.). As the result, as compared with the VOS standard of 1.125 to 1.275 (V), the fluctuation of the conventional circuit was in the range of 1.081 to 1.305 (V), and fell outside of the standard. In the present embodiment, the fluctuation of VOS was suppressed in the range of 1.179 to 1.221 (V), and satisfied the standard.

In the first embodiment, one end of the current source transistor 1 is connected to the standard power source (VDD) as the first power source, and applies the bias B1 which is the bias voltage to stabilize the fluctuation of the current from the standard power source is applied to the gate of the current source transistor 1. The gate of the current source transistor 6 is connected to the other end of the current source transistor 1, and the other end of the current source transistor 6 is connected to the standard power source (GND) as the second standard power source. Output NMOS transistors 2, 4 are connected serially between the current source transistors 1 and 6, output NMOS transistors 3, 5 are connected serially between the current source transistors 1 and 6, while the output NMOS transistors 3, 5 are connected in parallel with the output NMOS transistors 2, 4. Output terminal 7 is provided between the output NMOS transistors 2, 4. Output terminal 8 is provided between the output transistors 3, 5. End resistance 9 is provided between the output terminals 7, 8. Output NMOS transistors 2 to 5 and NMOS transistors 10, 11, which are the clamp circuits having the same fluctuation direction in the ON resistance due to temperature and process fluctuations as those of the output NMOS transistors 2 to 5, are provided at both sides of the end resistance 9.

Here, the NMOS transistors 10, 11, which are the clamp circuit, may be provided within the same chip, and the ON resistance can be fluctuated by the process and temperature fluctuations to control the output current flow. Accordingly, the output level shift can be eliminated, the driver circuit used in the LVDS interface can be made smaller in size, and the output level fluctuation due to process and temperature can be suppressed.

Also, in the first embodiment, the output level can be stabilized by performing correction by means of the clamp circuits. Thus, the standard voltage circuit 13 need not be a large sized returning standard voltage circuit with a high correction precision. Therefore, the circuit size can be reduced.

In the first embodiment, it has been explained that the bias B1, which is the bias voltage from the standard voltage circuit 13, is supplied to the gate of the current source transistor 1, and the drain voltage of the current source transistor 1 is supplied to the gate of the current source transistor 6. However, the present invention is not limited thereto. For example, the bias B1 from the standard voltage circuit 13 can be supplied to the gate of the current source transistor 6.

(Second Embodiment)

Figure 10:
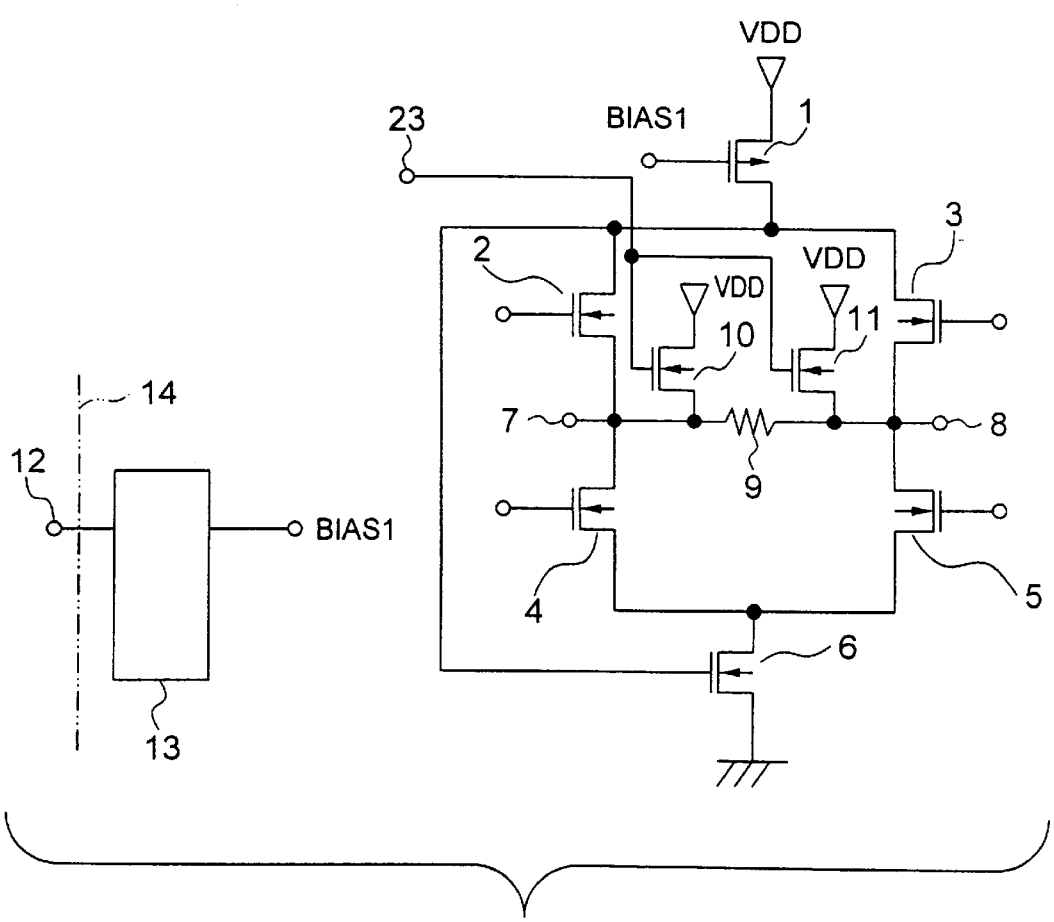
FIG. 10 is a circuit diagram showing a driver circuit of a second preferred embodiment of the present invention.

FIG. 10 is a circuit diagram showing a second embodiment of the driver circuit according to the present invention.

In the drawings explained below, the parts common in FIG. 1 and FIG. 8 have the same reference numerals, and the common explanations will be omitted.

As shown in FIG. 10, in the second embodiment, normally the gates of the NMOS transistors 10, 11 which compose the clamp circuits are connected to the power source (VDD) as shown in FIG. 6. However, in case of testing or when the output enable function is necessary, by taking the signal logic, the logic signals are applied to the gates of the NMOS transistors 10, 11.

That is, in a normal condition, the power source level which causes the diode-connection is inputted, and when Hiz (High Impedance) is needed, the GND level is inputted. Thereby, the current paths of the MOS transistors 10, 11, which are placed between the output terminals 7, 8 and the power source (VDD), can be completely disconnected.

Accordingly, in case if testing, or when the output enable function is necessary, the influence from MOS transistors 10, 11 is avoided.

As above mentioned, since the second embodiment enables application of the logic signals to the gates of the NMOS transistors 10, 11, when the testing or output enable function is necessary, the influence from MOS transistors 10, 11 can be avoided.

In the above embodiments, the current source transistor 1 is the PMOS, and the output NMOS transistors 2 to 5 and the current source transistor 6 are the NMOS. However, the present invention is not limited to these examples, the output NMOS transistors 2 to 5 and the current source transistor 6 can be PMOS.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A driver circuit comprising:
   a first current source transistor, one end of the first current source transistor being connected to a first standard power source, a gate of the first current source transistor being applied with a bias potential for stabilizing fluctuations in current from said first standard power source;
   a second current source transistor, a gate of the second current source transistor being connected to the other end of said first current source transistor, the other end of the second current source transistor being connected to a second standard power source;
   first and second output transistors connected in series between the other end of said first current source transistor and one end of said second current source transistor;
   third and fourth output transistors connected in series between the other end of said first current source transistor and one end of said second current source transistor, the third and fourth output transistors being connected in parallel with said first and second output transistors;
   a first output terminal provided between said first and second output transistors;
   a second output terminal provided between said third and fourth output transistors;
   a terminal resistance provided between said first and second output terminals; and
   clamp circuits provided at both ends of said terminal resistance.

2. The driver circuit according to claim 1, wherein said clamp circuits are composed of first and second MOS transistors, one end and a gate of the MOS transistors being connected to the first standard power source in common, the other end of the MOS transistors being connected to said terminal resistor.

3. The driver circuit according to claim 2, wherein said first and second MOS transistors are composed of NMOS, said one end is a drain, and said other end is a source.

4. The driver circuit according to claim 1, wherein said clamp circuits are provided within the same chip, and the direction of fluctuations in an ON resistance of the clamp circuits due to temperature and process fluctuations is the same as those of the said first to fourth output transistors.

5. The driver circuit according to claim 1, wherein said bias potential is provided by a standard potential circuit, and the gate of said second current source transistor is applied with a potential from the other end of said first current source transistor.

6. The driver circuit according to claim 1, wherein said bias potential is applied to the gates of said first and second current source transistors, respectively.

7. The driver circuit according to claim 1, wherein when a test or output enable function is needed, the gates of said clamp circuits can be provided with logic signals including the corresponding signal logic.

8. An output stabilization method for a driver circuit, comprising the steps of:

connecting one end of a first current source transistor to a first standard power source, and applying to a gate of the first current source transistor a bias potential for stabilizing fluctuations in current from said first standard power source;

connecting a gate of a second current source transistor to the other end of said first current source transistor, and connecting the other end of the second current transistor to a second standard power source;

connecting first and second output transistors in series between the other end of said first current source transistor and one end of said second current source transistor;

connecting third and fourth output transistors in series between the other end of said first current source transistor and one end of said second current source transistor while the third and fourth output transistors are arranged in parallel with said first and second output transistors;

providing a first output terminal between said first and second output transistors;

providing a second output terminal between said third and fourth output transistors;

providing a terminal resistance between said first and second output terminals; and providing clamp circuits at both ends of said terminal resistance, respectively.

9. The output stabilization method for a driver circuit according to claim 8, wherein said clamp circuits are composed by first and second MOS transistors, and one end and a gate of the MOS transistors are connected to the first standard power source in common, and the other end of the MOS transistors are connected to said terminal resistance.

10. The output stabilization method for a driver circuit according to claim 9, wherein said first and second MOS transistors are composed by NMOS, and making said one end be a drain and said other end be a source.

11. The output stabilization method for a driver circuit according to claim 8, wherein said clamp circuits are provided within the same chip, and making the direction of fluctuations in the ON resistance of the clamp circuits due to temperature and process fluctuations be the same as those of the said first to fourth output transistors.

12. The output stabilization method for a driver circuit according to claim 8, wherein said bias potential is supplied from a standard potential circuit, and a potential from the other end of said first current source transistor is applied to the gate of said second current source transistor.

13. The output stabilization method for a driver circuit according to claim 8, wherein said bias potential is applied to the gates of said first and second current source transistors.

14. The output stabilization method for a driver circuit according to claim 8, wherein logic signals including the corresponding signal logic is provided, when a test or output enable function is needed, to the gates of said clamp circuits.

* * * * *